United States Patent [19]

Whatley

[11] 4,450,367

[45] * May 22, 1984

[54] DELTA $V_{BE}$ BIAS CURRENT REFERENCE CIRCUIT

[75] Inventor: Roger A. Whatley, Austin, Tex.

[73] Assignee: Motorola, Inc., Schaumburg, Ill.

[ * ] Notice: The portion of the term of this patent subsequent to Aug. 3, 1999 has been disclaimed.

[21] Appl. No.: 330,062

[22] Filed: Dec. 14, 1981

[51] Int. Cl.³ .......................... G05F 3/16; H03L 1/00; H03L 5/00

[52] U.S. Cl. .................................... 307/297; 307/304; 323/315

[58] Field of Search ................ 323/312, 313, 315–317; 307/297, 304; 330/288

[56] References Cited

U.S. PATENT DOCUMENTS

| | | | |
|---|---|---|---|
| 3,886,435 | 5/1975 | Steckler | 323/315 |
| 4,342,926 | 8/1982 | Whatley | 307/297 |
| 4,361,797 | 11/1982 | Kojima et al. | 307/304 X |

FOREIGN PATENT DOCUMENTS

| | | | |
|---|---|---|---|
| 52553 | 5/1982 | European Pat. Off. | 323/315 |

OTHER PUBLICATIONS

Bonnet et al., "Active Starter Circuit For Closed-Loop Current Mirror", IBM Tech. Disl. Bull., vol. 22, No. 1, p. 148, Jun. 1979.

Bingham, "CMOS: Higher Speeds, More Drive and Analog Capability Expand its Horizons", Electronic Design 23, Nov. 8, 1978, pp. 74–82.

Tzanateas et al., "A CMOS Bandgap Voltage Reference", IEEE Journal of Solid State Circuits, vol. SC-14, No. 3, pp. 655–657, Jun. 1979.

*Primary Examiner*—Larry N. Anagnos
*Assistant Examiner*—David R. Bertelson
*Attorney, Agent, or Firm*—Anthony J. Sarli, Jr.; Jeffrey Van Myers; Robert Lee King

[57] ABSTRACT

A bias current reference circuit is disclosed having a first diode-connected bipolar device connected in series with an MOS device to develop a reference voltage which is proportional to a bias current. The reference voltage is used by an MOS device connected in series with a resistor which is connected in series with a second diode-connected bipolar device to develop a reference current which is proportional to the difference in the base to emitter voltages of the two bipolar devices. The reference current is used by a diode-connected MOS device to develop a bias voltage which is proportional to the reference current. The bias voltage in turn is used by another MOS device to develop the bias current in proportion to the bias voltage. The bias voltage is also used by other MOS devices to provide similar bias currents. In the disclosed embodiment, such a bias current can be used by a diode-connected CMOS device to develop a complementary bias voltage.

11 Claims, 1 Drawing Figure

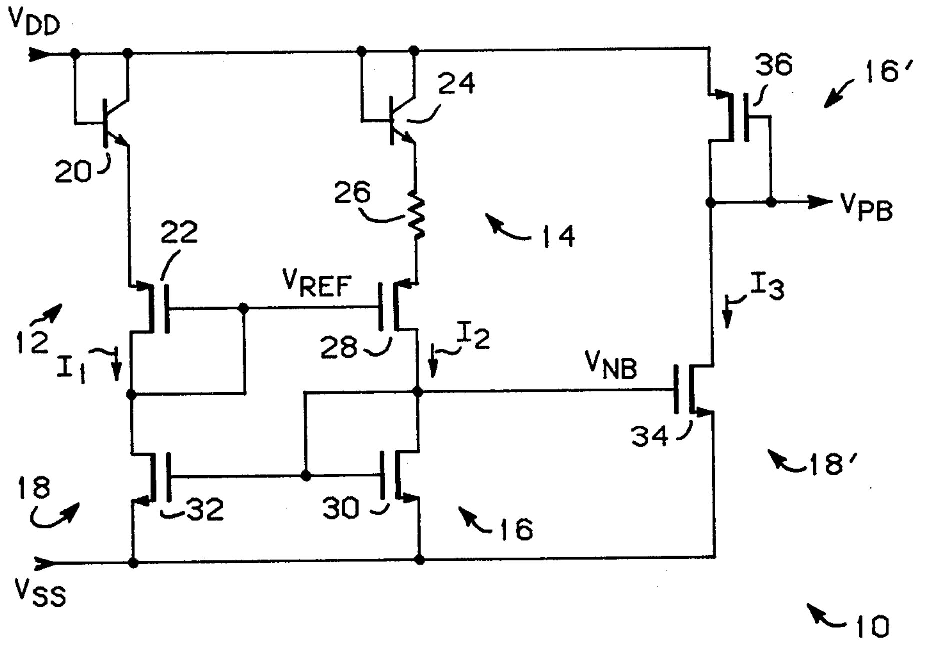
VDD
36
16'
24
20
26
VPB
14
22
VREF
I3
12
I1
28
I2
VNB
34
18'
18
32
30
16
VSS
10

DELTA $V_{BE}$ BIAS CURRENT REFERENCE CIRCUIT

TECHNICAL FIELD

This invention relates generally to reference circuits and, more particularly, to a circuit which provides reference voltages for $\Delta V_{BE}$ bias current generators and the like.

BACKGROUND ART

A convenient voltage reference standard by which bias currents may be established is the $V_{BE}$ of a transistor as noted in U.S. Pat. No. 4,342,926 entitled "Bias Current Reference Circuit". In such circuits, the base-emitter voltage $V_{BE}$ of a transistor is reflected across a resistor, R, to provide a reference current. However, reference circuits which provide a current that is proportional to the ratio of $V_{BE}/R$ are susceptible to process and temperature variations. The voltage $V_{BE}$ has a negative temperature coefficient and the resistance R has a positive temperature coefficient. Therefore, as the temperature rises, $V_{BE}$ decreases and R increases thereby causing the reference current to have a relatively strong temperature dependence.

BRIEF SUMMARY OF THE INVENTION

It is an object of the present invention to provide an improved bias current reference circuit.

Another object of the present invention is to provide an MOS bias current reference circuit which generates a bias voltage which is substantially supply voltage and process independent, using the $\Delta V_{BE}$ of two bipolar transistors.

Yet another object of the present invention is to provide an improved $\Delta V_{BE}$ bias current reference circuit which is substantially less sensitive to temperature variation than circuits of the prior art.

In carrying out the above and other objects and advantages of the present invention, there is provided, in one form, a voltage reference device which establishes a reference voltage in response to a control current directed therethrough. A voltage mirror coupled to the voltage reference device reflects the reference voltage as a control voltage coupled to a current reference portion comprising a current reference device and a resistor. The current reference portion provides a reference current which is proportional to the $\Delta V_{BE}$ of the voltage reference and current reference devices. A current mirror coupled to the current reference device directs a control current proportional to the reference current through the voltage reference device.

The above and other objects, features and advantages of the present invention will be more clearly understood from the following detailed description taken in conjunction with the accompanying drawing.

BRIEF DESCRIPTION OF THE DRAWING

The single FIGURE illustrates in schematic form a bias current reference circuit constructed in accordance with the preferred embodiment of the present invention.

DESCRIPTION OF THE PREFERRED EMBODIMENT

Shown in the single drawing is a bias current reference circuit 10 constructed in accordance with the preferred embodiment of the present invention. Reference circuit 10 is comprised generally of a reference voltage portion 12, a reference current portion 14, a bias voltage portion 16 and a bias current portion 18. In reference voltage portion 12, an NPN bipolar transistor 20 has the base and collector thereof connected to a positive supply voltage, $V_{DD}$, and the emitter thereof connected to the source of a P-channel MOS transistor 22. Transistor 22 has the gate and drain thereof connected together and to reference current portion 14 and bias current portion 18. In this configuration, a reference voltage, $V_{REF}$, with respect to positive supply voltage $V_{DD}$, is developed on the gate of transistor 22. Reference voltage, $V_{REF}$, is the sum of the base-emitter voltage, $V_{BE}$, of diode-connected transistor 20 and the gate-source voltage, $V_{GS}$, of diode-connected transistor 22. The $V_{GS}$ of transistor 22 is proportional to a bias current $I_1$ directed therethrough by bias current portion 18.

In reference current portion 14, an NPN bipolar transistor 24 has the base and collector thereof connected to positive supply voltage, $V_{DD}$, and the emitter thereof connected to a first terminal of a resistor 26. A second terminal of resistor 26 is connected to the source of a P-channel MOS transistor 28 which has the gate thereof connected to the gate and drain of transistor 22, and the drain thereof connected to bias voltage portion 16. Transistor 28 is constructed with a channel width to channel length ratio such that transistors 22 and 28 have the same channel current density. Therefore, the gate-source voltage $V_{GS}$ of transistor 28 is substantially the same as that of transistor 22. Applying Kirchoff's voltage law to the loop comprising transistors 20, 22, 24 and 28 and resistor 26, results in the equation:

$$V_{BE20}-V_{BE24}-\Delta V_{BE}=0.$$

Thus the difference in the base-emitter voltages, $\Delta V_{BE}$, will be reflected across resistor 26. Reference current portion 14 therefore provides a reference current $I_2$ which is proportional to reference voltage $V_{REF}$ provided by reference voltage portion 12.

In bias voltage portion 16, an N-channel MOS transistor 30 has the source thereof connected to a negative supply voltage, $V_{SS}$, and the gate and drain thereof connected to the drain of transistor 28 of reference current portion 14. In this configuration, the diode-connected transistor 30 will develop a gate-source voltage, $V_{GS}$, which is proportional to the reference current, $I_2$. The voltage at the gate of transistor 30 is suitable for biasing other N-channel MOS transistors used as constant bias current sinks.

In bias current portion 18, an N-channel MOS transistor 32 has the source thereof connected to negative supply voltage $V_{SS}$, the gate thereof connected to the gate and drain of transistor 30, and the drain thereof connected to the gate and drain of transistor 22. In this configuration, transistor 32 will allow a bias current $I_1$, proportional to a bias voltage which is the $V_{GS}$ of transistor 30, to flow through transistors 20 and 22 of reference voltage portion 12.

In operation, a shift at the emitters of transistors 20 and 24 caused by a shift in positive supply voltage $V_{DD}$ relative to negative supply voltage $V_{SS}$, will be reflected by transistors 22 and 28 as a corresponding shift in the voltage at each terminal of resistor 26. However, the voltage across resistor 26 remains constant. Therefore, the current provided by resistor 26 will remain constant even when $V_{DD}$ shifts, provided the temperature is constant. So long as the current provided by resistor 26 is constant, the $V_{GS}$ of transistor 30 tends to remain constant relative to $V_{SS}$, even in the presence of significant shifts in $V_{SS}$, provided the temperature is constant. Thus the bias voltage $V_{GS}$, of transistor 30, although referenced to the $\Delta V_{BE}$ of transistors 20 and 24, remains substantially independent of shifts in supply voltages $V_{DD}$ and $V_{SS}$.

A shift in temperature will similarly have substantially little effect on bias current $I_2$. Bias current $I_2$ can be expressed as:

$$I_2=(\Delta V_{BE})/(R_{26})$$

where it can be readily shown that $$\Delta V_{BE}=[(kT)/(q)]\times \ln [(I_{20}/I_{24})\times(A_{24}/A_{20})]$$

where, k = Boltzman's constant;
q = electrical charge in Coulombs;
T = temperature in degrees Centigrade;
$A_{20}$ = the emitter junction area of transistor 20;
$A_{24}$ = the emitter junction area of transistor 24;
$I_{20}$ = the current through transistor 20; and
$I_{24}$ = the current through transistor 24.

The conventionally known temperature coefficient of $\Delta V_{BE}$ is approximately +3400 ppm/°C. and the temperature coefficient of resistor 26 is approximately +1300 ppm/°C. Therefore, the temperature coefficient of reference current $I_2$ is approximately +2100 ppm/°C. or 0.0021%/°C. This temperature coefficient compares to approximately 0.0047%/°C. for a $V_{BE}$ bias current reference. A $V_{BE}$ reference generator has poorer temperature stability because the temperature coefficient of $V_{BE}$ is approximately −3400 ppm/°C., and as temperature increases, $V_{BE}$ decreases and R increases causing the reference current to change noticeably. However, for a $\Delta V_{BE}$ reference, $\Delta V_{BE}$ increases and R increases so that the variation of reference current is much less.

In some applications, it may be desirable to provide a P-channel bias voltage $V_{PB}$, as a counterpart for the N-channel bias voltage $V_{NB}$. In the illustrated embodiment, this is accomplished using a second bias current portion 18′ and a second bias voltage portion 16′. In second bias current portion 18′, an N-channel MOS transistor 34 has the source thereof connected to negative supply voltage $V_{SS}$, the gate thereof connected to the gate and drain of the transistor 30 of the bias voltage portion 16 and to the drain of transistor 28, and the drain thereof connected to second bias voltage portion 16′. In second bias voltage portion 16′, a P-channel MOS transistor 36 has the gate and drain thereof connected to the drain of transistor 34, and the source thereof connected to positive supply voltage $V_{DD}$. In this configuration, transistor 34 will allow a bias current $I_3$, proportional to the N-channel bias voltage $V_{NB}$, to flow through transistor 36. In response to bias current $I_3$, diode-connected transistor 36 develops a gate-source voltage $V_{GS}$ which is proportional to bias current $I_3$, but referenced to the positive supply voltage $V_{DD}$ rather than the negative supply voltage $V_{SS}$. This voltage, indicated as $V_{PB}$, is suitable for biasing other P-channel MOS transistors used as constant current sources. If reference circuit 10 is embodied in an integrated form, transistors 20 and 24 may be readily fabricated using conventional MOS fabrication processes.

Upon initial application of power, bias current reference circuit 10 may assume either an inactive or an active state. For example, if no current flows through reference voltage portion 12 during power up, no reference voltage will be developed for application to reference current portion 14. Thus, no reference current will be provided by reference current portion 14. Without reference current, bias voltage portion 16 will be unable to establish bias voltage $V_{NB}$ and enable bias current portion 18 to direct bias current through reference voltage portion 12. Therefore, bias current reference circuit 10 will remain in an inactive state. To prevent the possibility of an inactive state, a conventional start-up circuit (not shown) is required to allow start-up current to flow through reference voltage portion 12 when P-channel bias voltage $V_{PB}$ is less than a predetermined threshold.

While specific N-channel and P-channel MOS devices are shown, it should be clear that bias current reference circuit 10 could be implemented by completely reversing the processing techniques (e.g. P-channel to N-channel) or by using other types of transistors. Further, while the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A $\Delta V_{BE}$ bias current reference circuit comprising:
reference voltage means comprising a first bipolar transistor, for providing a reference voltage proportional to a bias current;
reference current means coupled to the reference voltage means comprising a second bipolar transistor coupled in series with a resistor, for providing a reference current proportional to the ratio of the difference in the base to emitter voltages, $\Delta V_{BE}$, of said first and second bipolar transistors and the resistance of said resistor;
bias voltage means coupled to the reference current means, for providing a bias voltage proportional to said reference current; and
bias current means coupled to both the reference voltage means and the bias voltage means, for providing the bias current proportional to the bias voltage for said reference voltage means.

2. The $\Delta V_{BE}$ bias current reference circuit of claim 1 wherein the first bipolar transistor is diode-connected and coupled in series with a diode-connected first MOS transistor, said first MOS transistor developing said reference voltage on the gate thereof.

3. The $\Delta V_{BE}$ bias current reference circuit of claim 1 or 2 wherein said second bipolar transistor is diode-connected, and said resistor is coupled in series with a second MOS transistor having said reference voltage coupled to the gate thereof.

4. The $\Delta V_{BE}$ bias current reference circuit of claim 1 or 2 wherein the bias voltage means comprises a diode-connected third MOS transistor having said reference current coupled thereto, said third MOS transistor developing the bias voltage on the gate thereof.

5. The $\Delta V_{BE}$ bias current reference circuit of claim 1 or 2 wherein the bias current means comprises a fourth MOS transistor having the bias voltage coupled to the gate thereof, said fourth MOS transistor providing the bias current for the reference voltage means.

6. The $\Delta V_{BE}$ bias current reference circuit of claim 1 or 2 further comprising:

second bias current means coupled to the bias voltage means, for providing a second bias current which is proportional to the bias voltage.

7. The $\Delta V_{BE}$ bias current reference circuit of claim 6 wherein the second bias current means comprises a fifth MOS transistor having the bias voltage coupled to the gate thereof, said fifth MOS transistor providing said second bias current.

8. The $\Delta V_{BE}$ bias current reference circuit of claim 6 further comprising:

second bias voltage means coupled to said second bias current means, for providing a second bias voltage proportional to the second bias current.

9. The $\Delta V_{BE}$ bias current reference circuit of claim 8 wherein said second bias voltage means comprises a diode-connected sixth MOS transistor having the second bias current coupled thereto, said sixth MOS transistor developing the second bias voltage on the gate thereof.

10. A CMOS $\Delta V_{BE}$ bias current reference circuit comprising:

a first bipolar transistor having the base and collector thereof coupled to a supply voltage of a first polarity;

a first MOS transistor of a first conductivity type having the source thereof coupled to the emitter of the first bipolar transistor;

a second MOS transistor of said first conductivity type having the gate thereof coupled to the gate of said first MOS transistor;

a resistor having a first terminal, and a second terminal coupled to the source of said second MOS transistor;

a second bipolar transistor having the emitter thereof coupled to the first terminal of said resistor, and the base and collector thereof coupled to said supply voltage of the first polarity;

a third MOS transistor of a second conductivity type having the source thereof coupled to a supply voltage of a second polarity, and the gate and drain thereof coupled to the drain of the second MOS transistor; and a fourth MOS transistor of said second conductivity type having the source thereof coupled to said supply voltage of the second polarity, the gate thereof coupled to the gate and drain of said third MOS transistor, and the drain thereof coupled to the gate and drain of said first MOS transistor.

11. The CMOS $\Delta V_{BE}$ bias current reference circuit of claim 10 further comprising:

a fifth MOS transistor of said second conductivity type having the source thereof coupled to said supply voltage of the second polarity, and the gate thereof coupled to the gate and drain of said third MOS transistor; and a sixth MOS transistor of said first conductivity type having the source thereof coupled to said supply voltage of the first polarity, and the gate and drain thereof coupled to the drain of said fifth MOS transistor.

* * * * *